United States Patent
Harmon et al.

(10) Patent No.: US 7,179,731 B2
(45) Date of Patent: Feb. 20, 2007

(54) HYPERCONTACTING

(76) Inventors: Eric Harmon, 314 Main St., Norfolk, MA (US) 02056; David Salzman, 4407 Elm St., Chevy Chase, MD (US) 20815; Jerry Woodall, 500 Prospect St., New Haven, CT (US) 06611-2166

(*) Notice: Subject to any disclaimer, the term of this patent is extended or adjusted under 35 U.S.C. 154(b) by 0 days.

(21) Appl. No.: 10/349,831

(22) Filed: Jan. 22, 2003

(65) Prior Publication Data

US 2004/0029368 A1 Feb. 12, 2004

Related U.S. Application Data

(60) Provisional application No. 60/350,503, filed on Jan. 22, 2002.

(51) Int. Cl.
*H01L 21/28* (2006.01)
(52) U.S. Cl. ............................ 438/602; 438/604
(58) Field of Classification Search ........ 438/602–607, 438/479–509, 22–47, 565–569, 518
See application file for complete search history.

(56) References Cited

U.S. PATENT DOCUMENTS

| | | | | |
|---|---|---|---|---|
| 4,385,938 A * | 5/1983 | Park et al. | ................... | 438/520 |
| 4,583,110 A * | 4/1986 | Jackson et al. | ............. | 257/734 |
| 5,053,846 A * | 10/1991 | Morizuka | ................... | 257/200 |
| 5,196,370 A * | 3/1993 | Tara et al. | ................... | 438/522 |
| 5,866,925 A * | 2/1999 | Zolper et al. | ............... | 257/279 |
| 2001/0015437 A1* | 8/2001 | Ishii et al. | ..................... | 257/12 |
| 2003/0121468 A1* | 7/2003 | Boone et al. | ................. | 117/78 |
| 2003/0129820 A1* | 7/2003 | Walukiewicz et al. | ...... | 438/604 |

\* cited by examiner

*Primary Examiner*—Savitri Mulpuri

(57) ABSTRACT

The invention, called hypercontacting, achieves a very high level of activated doping at an exposed surface region of a compound semiconductor. This enables production of low resistance ohmic contacts by creating a heavily doped region near the contact. Such region lowers the contact's tunneling barrier by decreasing the extent of the depletion region at the contact, thereby reducing resistance.

2 Claims, 20 Drawing Sheets

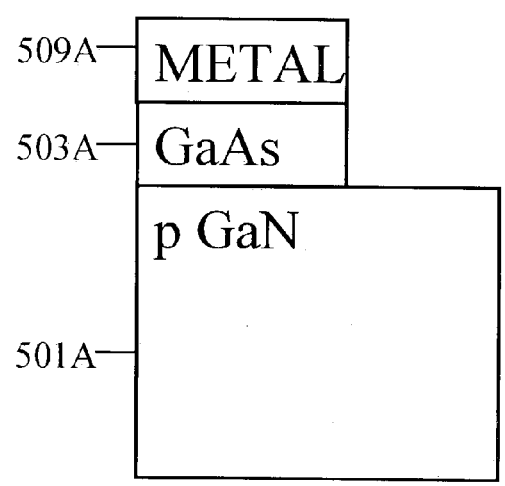
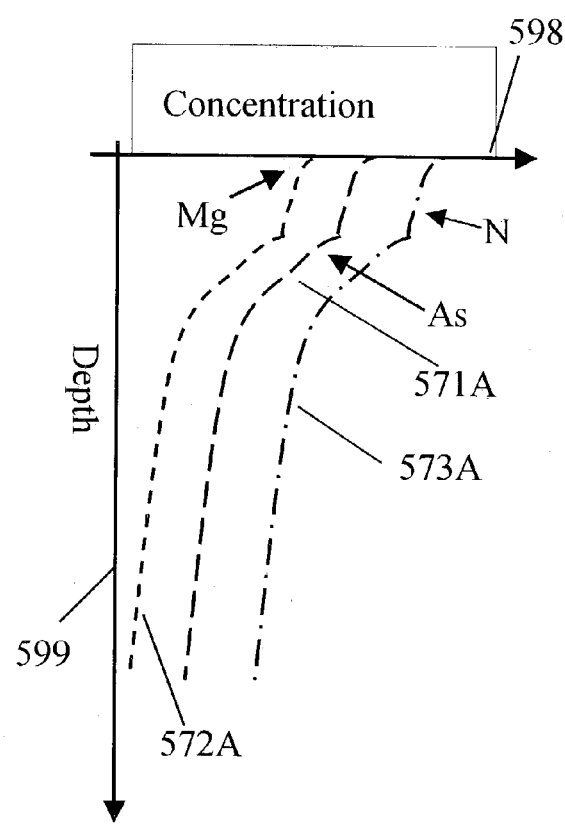
Figure 5D
Figure 5E

HYPERCONTACTING

This application claims the benefit of provisional application No. 60/350,503 filed Jan. 22, 2002.

FIELD OF THE INVENTION

This invention relates generally to the fields of solid-state physics and electronics, more particularly to the design and fabrication of semiconductor materials and devices, and still more particularly to the design and fabrication of contacts to semiconductor materials and devices for high-performance optoelectronic and microelectronic applications.

BACKGROUND OF THE INVENTION

Low resistance ohmic contacts, particularly to many semiconductors with a band gap greater than 1 eV, are problematic for a number of well-known reasons:

First, metal/semiconductor contacts typically exhibit a large Schottky barrier height because the work function of the metal often places the metal Fermi level somewhere near the middle of the band gap. Also, Fermi level pinning by surface states also tends to pin the surface Fermi level near mid-gap. Both of these effects tend to make the Schottky barrier heights larger than 0.5 eV. Such large Schottky barrier heights prevent the formation of simple ohmic contacts where the Fermi level in the metal makes direct (i.e. barrier free) contact to the semiconductor conduction or valence band.

Second, tunneling ohmic contacts are problematic because it is difficult to produce extremely heavy doping in semiconductors with a band gap larger than 1.0 eV, as described in co-pending U.S. patent application Ser. No. 10/277,352, filed Oct. 22, 2002 (which is incorporated herein by reference). Heavy doping is required for a tunneling ohmic contact because heavy doping supports narrow depletion regions, which increase the probability for tunneling through the depletion region into the semiconductor. Heavy doping is often more difficult for one conductivity type (i.e. p-GaN contacts are much harder than n-GaN contacts because it is hard to achieve heavy p-type doping of GaN, while achieving heavy n-type doping is significantly easier).

Consequently, a general solution that would enable lower resistance ohmic contacts to be achieved for most wide band gap semiconductors would be highly desirable.

Lower resistance contacts are important because device performance can be improved by lowering power losses at contacts, which also tends to improve contact reliability. For example, light emitting diodes (LEDs) produced using GaN usually exhibit an excess voltage drop due to the resistance of the contacts. A significant component of such voltage drops can be attributed to the high resistance of typical p-GaN contacts. This excess voltage drop increases the power dissipation of the LED and ultimately limits the output power. Furthermore, low resistance p-GaN contacts enable a higher current density to be used before significant contact degradation occurs, thus resulting in improved performance and the capability to operate at higher current densities. Similarly, laser diodes produced in such wide band gap materials exhibit similar power and performance losses due to high resistance p-GaN contacts, and would therefore benefit from improved contacts.

OBJECTS AND SUMMARY OF THE INVENTION

In light of the above, one object of the present invention relates to methods for producing low resistance ohmic contacts by creating a heavily doped region near the contact that lowers the tunneling barrier by decreasing the extent of the depletion region at the contact and thereby reduces resistance. The invention, called hypercontacting technology, is capable of achieving a very high activated doping at an exposed surface region of a compound semiconductor.

Another object of the invention relates to useful devices (e.g., LEDs, transistors, detectors, lasers, etc.) made, at least in part, from the hypercontacting technology.

A further object of the invention relates to electronic, microelectronic and/or electro-optical systems comprised, at least in part, of devices made, at least in part, from the hyper-contacting technology.

A still further object of the invention relates to methods for introducing both a high anion pressure and a high dopant ion concentration near a semiconductor contact region.

Another object of the invention relates to methods for improving contact resistance by introducing damage to the contact region to enable lower annealing temperatures or improved contacts at the same annealing temperature.

Yet another object of the invention relates to methods for creating a heavily doped semiconductor region near a contact, while avoiding or mitigating the formation of one or more of the following effects ordinarily found at the doping level of said materials formed by prior art methods: (i) precipitation of the dopant; (ii) interstitial dopant; (iii) anti-site or vacancy compensation of the dopant; (iv) migration of a dopant; and/or (v) amphoteric dopant compensation.

The instant hypercontacting invention typically entails the production of a thin, heavily doped semiconductor region near the contact/semiconductor interface in order to facilitate a low resistance tunneling ohmic contact. This thin, heavily doped region is preferably achieved by introducing:

1. dopant ions in or near the semiconducting surface region to be contacted.
2. a high anion pressure in or near the semiconductor surface region to be contacted in order to activate the dopant ions preferentially, (Preferential activation of a dopant means that the dopant ions are preferentially forced into acceptor sites for p-type contacts, or onto donor sites for n-type contacts.)
3. Optionally, damage to the semiconductor near the contact region may be introduced to lower the activation energy of the dopants, enabling annealing at lower temperatures or improved contacts at the same annealing temperature.

In order to achieve sufficient dopant activation, high temperature anneals are usually be required. Unfortunately, high temperatures ordinarily make it difficult to simultaneously introduce a high anion pressure, because anions are typically volatile, and therefore desorption and depletion of anions at a surface region occurs. Depletion of anions at a surface often acts to reduce the activation of the dopant and therefore undesirably increases the contact resistance.

The invention advantageously provides a technique for simultaneously introducing high dopant concentration(s) and high anion pressure(s) to a semiconductor surface region during anneal to promote the incorporation of the dopant(s) onto active doping sites, enabling low resistance contacts to be achieved.

One key aspect of this invention is the recognition that the excess anion pressure may be provided by an anion different from the semiconductor anion. For example, consider contacts to p-GaN. It may be difficult to provide a high nitrogen anion pressure to the p-GaN surface. However, we recognize that it is not necessary to use nitrogen anions, and indeed may be preferable to use an alternative anion such as As, P, or Sb, or a combination of anions. A combination of anions may include any number of species from column VB of the periodic table in the case of III-V semiconductors, such as using both excess As and excess N to provide the excess anion pressure. Similarly, for II-VI semiconductors, the anions would consist of any species (or combination of species) from column VIB of the periodic table.

A second key aspect of this invention is the recognition that a high dopant activation can be achieved by simultaneously introducing a high concentration of appropriate dopant atoms with the high excess concentration of anions as described above. We have developed a theoretical framework of heavy doping in compound semiconductors which quantatively explains the relationship between anion pressure, dopant atom pressure, and doping efficiency. This theoretical framework predicts that significantly higher activated dopant concentrations are thermodynamically more favorable in depletion regions than in neutral regions. This is because it is thermodynamically more favorable for the semiconductor region to have the Fermi level near mid gap, rather than near one of the band edges. Inside a depletion region, the Fermi level remains near mid gap even in the presence of a high density of activated dopant ions, so the introduction of active dopant ions need not significantly disturb the thermodynamic equilibrium. The introduction of dopant ions will decrease the width of the depletion region, which is a primary goal of the invention, namely achieving low resistance contacts by increasing the probability of tunneling, such as by lowering the Schottky barrier height, lowering the extent of the depletion region, or both.

The third aspect of this invention recognizes that the covalent bonds in many semiconductors are extremely strong, and introduction of dopant ions onto active substitutional sites requires breaking of those bonds. While high temperatures can be used to facilitate the breaking of these bonds, it may be desirable to disrupt those bonds prior to annealing the contact. Disruption of the bonds prior to annealing is viewed as optional because high temperature annealing alone may provide sufficient energy to break the covalent bonds and substitute the dopant ions. However, introducing damage to the surface region may enable lower temperature annealing, or improved contacts at the same annealing temperature.

THEORY

In order to appreciate certain aspects of the hypercontact technology, it is helpful to consider, in detail, the doping thermodynamics of Mg doping of GaN. When GaN is doped with Mg, the concentration of Mg dopant on Ga sites, $Mg_{Ga}$, is in thermodynamic equilibrium with the sum of the Ga vacancy concentration, $V_{Ga}$, plus the Mg interstitial concentration, $Mg_i$:

$$Mg_{Ga} \leftrightarrows V_{Ga} + Mg_i \qquad (1)$$

There is also an electronic equilibrium. The concentration of neutral Mg on Ga sites is defined as $N_A$ and $N^-_A$ is the concentration of ionized Mg on Ga sites. Such atoms are deep p-type acceptors (~200 meV activation energy). The concentration of interstitial Mg is defined as $N_D$, and the concentration of ionized interstitial Mg is defined as $N^+_D$. Such atoms are deep donors.

Simultaneously, the concentration of neutral Mg on Ga sites, $N_A$, is in equilibrium with the sum of the concentration of ionized Mg on Ga sites, $Mg^-_{Ga}$, plus the concentration of holes, p. That is, $Mg_{Ga} \leftrightarrows Mg^-_{Ga} + p$.

Substituting from (1), we find $N_A \leftrightarrows V_{Ga} + N_D \leftrightarrows N^-_A + p$.

The concentration of neutral Mg on interstitial sites (a deep level donor site) is in equilibrium with the sum of the concentration of ionized Mg on interstitial sites plus the concentration of electrons, n. Solving for $N_D$ tells us that $N_D \leftrightarrows N^+_D + n$.

In the well-known Schottky vacancy equilibrium equations, $V_{Ga} = K'(T) \times P_{N2}$ and $V_N = K''(T) \times P_{N2}$ where $K'(T)$ and $K''(T)$ are mass action constants relating the Ga vacancy concentration, $V_{Ga}$, or the N vacancy concentration, $V_N$ to the anion pressure, $P_{N2}$. Collecting terms from these equations leads to a final equation relating the concentration of ionized Mg on acceptor sites to the concentration of ionized Mg on donor sites:

$$Mg^-_{Ga}/Mg_i^+ = (K'(T) \times P_{N2}) \times (n_i/p)^2 \qquad (2)$$

Similarly, the concentration of ionized Mg on acceptor sites to the concentration of ionized $V_N$ (a deep donor) is:

$$Mg^-_{Ga}/V_{N2}^+ = (K_i''(T) \times P_{N2}) \times (n_i/p)^2 \qquad (3)$$

These equations can be combined into a single equation:

$$N^-_A/N^+_D = (K_i'''(T) \times P_{N2}) \times (n_i/p)^2 \qquad (4)$$

where $n_i$ is the intrinsic carrier concentration of the material at temperature T, and $n_i^2 = (n \times p)$ at equilibrium.

At low doping concentrations, the material is intrinsic, and the $(n_i/p)^2$ term is unity. If the $(K'''(T) \times \Box P_{N2})$ term is >1, the material is p-type by definition and $(N^-_A/N^+_D) > 1$, meaning $N^-_A > N^+_D$. If the $(K'''(T) \times P_{N2})$ term is <1, the material is n-type by definition and $(N^-_A/N^+_D) < 1$, meaning $N^-_A < N^+_D$.

For higher doping levels, $p > n_i$ so $(n_i/p)^2 < 1$. The physics is now clear. Reorganizing equation (4), carrier saturation occurs when $$(n_i/p)^2 = 1/(K'''(T) \times P_{N2}) \qquad (5)$$

so the $(N^-_A/N^+_D)$ term approaches unity.

For thermodynamic reasons, the material can never cross from p-type to n-type by the addition of more p-type (e.g., Mg) dopant, nor from n-type to p-type by the addition of n-type (e.g., Si) dopant. This is often expressed by stating that the limiting value of $\log(N^-_A/N^+_D)$ cannot change sign, lest increasing the dopant concentration force a change in sign from n-type to p-type or vice versa, which would Mg unphysical. Equation (5) is an algebraic realization of carrier saturation via increased doping by the same dopant, so precludes $(n_i/p)^2$ from growing any smaller beyond carrier saturation.

How can one use this insight to increase the critical saturation limit? in other words, make p larger and $(n_i/p)^2$ smaller, without changing the sign of $\log (N^-_A/N^+_D)$? Several avenues are available, separately or in combination.

One could raise the crystal's temperature, T, thereby raising $n_i$ regardless of the impact on $K'''(T)$ One could also raise $K'''(T)$ by some method.

And/or one could raise the anion pressure, $P_{N2}$.

Raising $n_i$ is challenging, due to surface degradation at higher temperatures. There are, nevertheless, many ways to raise $n_i$, such as using one or more rapid thermal quenches after one or more relatively high temperature anneals. Such anneal cycle(s) should preferably be kept brief, since there are generally important upper limits on sustained substrate temperatures. Specifically, a rapid high temperature thermal anneal and quench raises $n_i$, whose effect in equation (4) is quenched upon return to room temperature, which in turn raises $N^-_A/N^+_D$ upon return to room temperature. Alternatively, we could raise $P_{N2}$. We note that hypercontacts may also be accomplished by performing, for example, a Mg implant and an anion (e.g., As) implant into the semiconductor material, followed by one or more rapid thermal anneal (RTA) cycles.

As noted previously, raising $P_{N2}$ may be difficult to do in practice. This does not, however, preclude us from raising the anion pressure by incorporating an anion other than $N_2$. This is an important point. If we raise the anion pressure by introducing an overpressure of As, P, or Sb, the effect will be substantially the same as increasing $P_{N2}$, enabling the GaN to be effectively hyperdoped. Furthermore, if the anion overpressure is introduced to GaN surface, along with a high concentration of a dopant atom such as Mg, conversion of a thin surface region to a high density of acceptor concentrations is achieved, which will decrease the surface depletion region (due to Schottky barriers and surface Fermi level pinning at the surface), thereby reducing the tunneling barrier and lowering contact resistance. This conversion process, whereby dopants are forced onto the correct substitutional sites (in this case cation sites) in preference to all other forms (including interstitial sites, precipitates, or incorrect substitutional sites) is sometimes termed "activation".

Si is amphoteric, so can go on either cation (where it is a donor) or anion (where it is an acceptor) sites. Controlling the anion/cation ratio preferentially forces silicon onto one site or the other, as explained in the equations above. Activation would occur for Si on either site, but ordinarily one wants to control the activation site by choosing an anion or cation overpressure.

It is noted that hypercontact technology, in accordance with an aspect of these teachings, may also be accomplished by performing, for example, a Mg implant and an anion (e.g., As) implant into the semiconductor material, followed by one or more rapid thermal anneal (RTA) cycles.

In order to prevent anion depletion at a surface due the vapor pressure of an anion species, it can be advantageous to provide a capping layer acting as a barrier to anion diffusion out of the semiconductor. The capping layer may be formed from any of a number of materials able to withstand the high temperature anneal, such as a refractory metal, $SiO_2$, $Si_3N_4$, or $Al_{0.25}Ga_{0.75}As$. In the case of an $Al_{0.25}Ga_{0.75}As$ capping layer, it may also be advantageous to place a sacrificial GaAs wafer in intimate contact on top of the capping layer to provide an additional anion pressure (from the GaAs wafer to the $Al_{0.25}Ga_{0.75}As$ capping layer) and prevent significant depletion of anion from the $Al_{0.25}Ga_{0.75}As$ capping layer.

As those ordinarily skilled in the art will recognize, the hypercontacting techniques of the present invention are readily applicable to other compound semiconductors where excess anion incorporation is possible, such as III-V materials like GaAs, InP, GaP, InN, AlN, etc., and II-VI materials like ZnS, ZnSe, etc. Hypercontacting also generalizes to other Group IV amphoteric dopants, such as Si, Ge, C, and so forth; other Group II amphoteric dopants, such as Be, Zn, Mg, Cd, etc.; and other compound semiconductors, such as InAs, GaP, GaAlAs, GaInAs, GaInAsN, InN, GaN, AlN, GaAlN, InGaN and related compounds. For instance, the method can be used to improve the contact resistance of GaAs and GaP by providing the combination of a dopant atom and where the anion is advantageously N, As, P, or some combination thereof. A rapid thermal anneal (RTA) at a high substrate temperature (such as 900° C.) may then advantageously employed to activate the dopant ions.

Finally, we note that the above analysis applies equally to AlGaN and InGaN, thereby providing a route to producing low resistance hypercontacts to a wide range of the III-V nitride semiconductors. Furthermore, the above analysis is not limited to Mg doping, and indeed any common dopant atom may be substituted for Mg above, including Be, Zn, Mn, Cd and any other p-type dopant.

In addition, the hypercontact approach is not limited to p-type contacts. For example, hypercontacts using n-type dopants such as Ge, Si, or Sn and an excess anion pressure can preferentially force such dopants onto cation sites, where these dopants will act as donors. In the case of these n-type dopants, they may self compensate by substituting onto anion sites, so the analysis should substitute interstitial dopant for amphoteric doping on anion sites.

Furthermore, the hypercontact approach is not limited to the nitrides. The hypercontact approach will work with any III-V compound semiconductor, and provides a route to improving the contact resistance to layers such as GaP, GaInP, AlGaAs, GaAs, AlInAs, etc.

We also note that the hypercontact approach is not limited to III-V semiconductors, but also provides a means of forming low resistance ohmic contacts to II-VI semiconductors as well, by providing a suitable combination of anion pressure (now from group VIB of the periodic table) and dopant atoms to the surface region to be contacted.

BRIEF DESCRIPTION OF THE DRAWINGS

Various aspects, features, advantages and applications of the present invention are described in connection the Description of Illustrative Embodiments below, which description is intended to read in conjunction with the accompanying set of drawings, in which:

FIGS. 5A–E show an alternative embodiment where ohmic contacts are made to p-AlGaN using deposited the combination of deposited GaAs and implantation to provide the doping and excess anions;

DETAILED DESCRIPTION OF THE FIGURES

Figure 1:
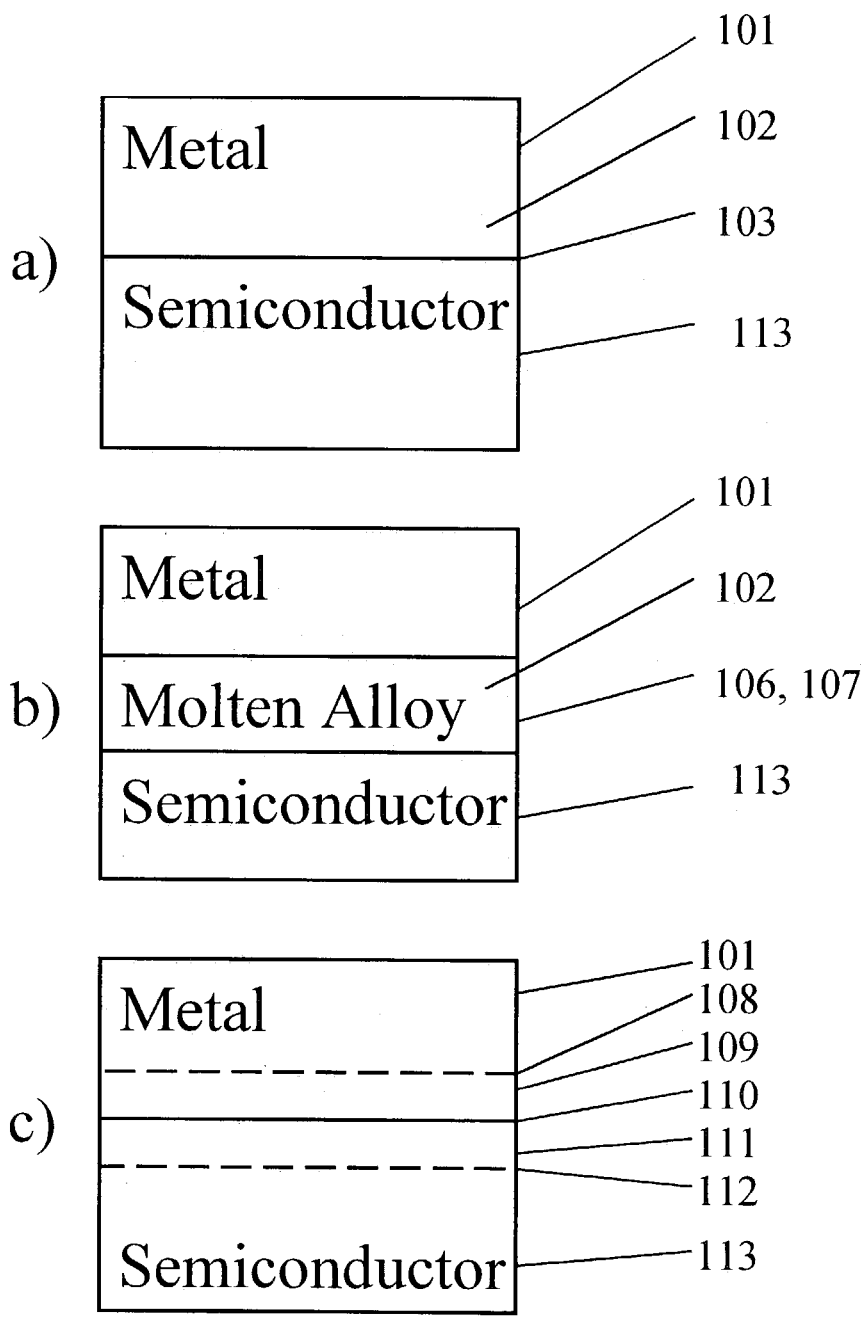
FIGS. 1A–C depict a prior art process for creating an ohmic contact.

Reference is now made to FIGS. 1A–C, which depict the creation of an ohmic contact by a prior art process. Traditionally, ohmic contact resistance is lowered by alloying a metal contact using localized crystal growth. This is done by affixing a metal 101 which contains a suitable dopant 102 (e.g., AuGe bearing Zn) adjacent to the semiconductor material 113 as in FIG. 1A, and heating the semiconductor to a temperature sufficient to liquefy both it and the metal in contact with it at their common interface 103.

As depicted in FIG. 1B, the heated semiconductor and metal dissolve into one another around the interface, forming a molten region 106 of alloy 107 in a liquid phase, enriched by the dopant 102. The molten region 106 may encompass the entire thickness of some or all of 101, or the entire thickness of some or all of 113, both, or just some of the thickness (as depicted).

When the melt is cooled and the semiconductor recrystallized in 111 (see FIG. 1C), the concentration of the dopant is enhanced in 111 compared to 113. There may or may not be a clean or planar interface 112 between the old and recrystallized semiconductor. The recrystallized region of the metal 109 is usually dopant-poor because dopant has diffused into 111 from 109, but 109 is generally still highly conductive. There may or may not be a clean or planar interface between old and recrystallized metal at 108.

Unfortunately, this standard prior art approach is sensitive to a number of factors, including among others, variation in the temperature and thickness of the melt; non-planarities in the interface region (e.g., spiking of AuGe interfaces into GaAs) due to preferential dissolution along certain crystallographic planes, surface tension, or other effects; mechanical instability of the melt zone 106 during the heating process (including temperature ramping); variation in size of the alloyed region 111; and others. The interfaces at 108 and 112 may not be planar or parallel to the new metal-semiconductor interface 110. Interface 110 might be displaced from 103 and might not itself be planar. Most commonly in practice, surface tension will cause non-planar metal-semiconductor interfaces 110, thus preventing scaling to smaller lithographic feature sizes or smaller semiconductor devices.

Figures 2A, 2B:
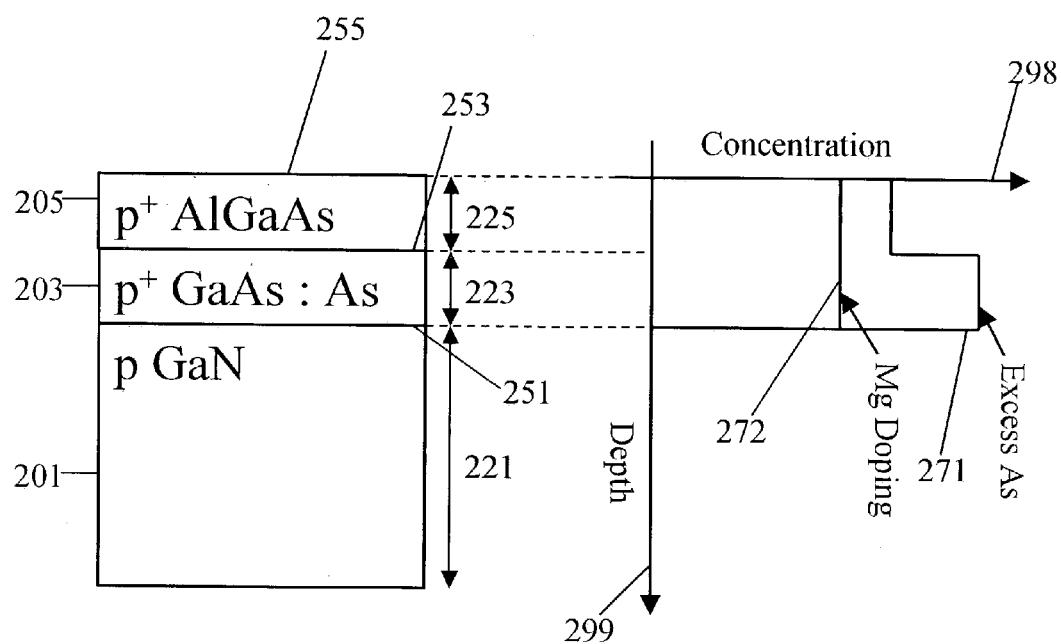
FIGS. 2A–E depict a tunneling ohmic contact made in accordance with the invention.
Figure 2C:
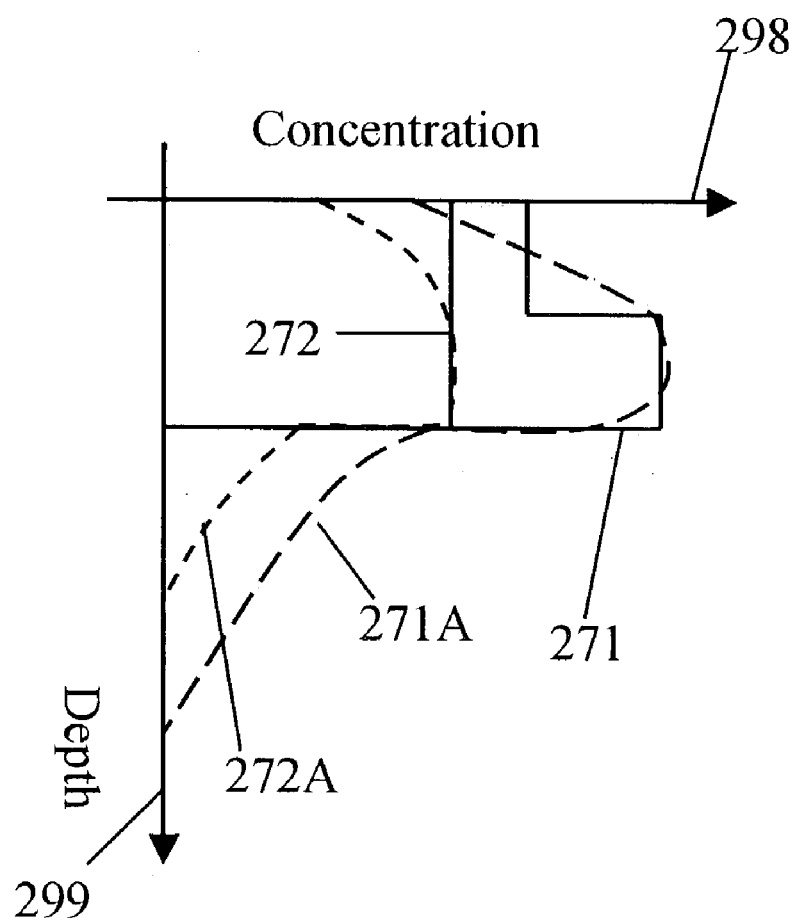

FIGS. 2A–C shows the preferred embodiment of the hypercontacting technology. In FIG. 2A, a GaAs region 203 of thickness 223 is deposited on top of the p-type GaN region of 201 where a low resistance contact is desired. Region 203 is doped with Mg to approximately $1 \times 10^{21}$ cm$^{-3}$ to provide a concentrated source of p-type dopant ions. In addition, Region 203 contains an excess arsenic concentration, which is used to provide an extremely high anion pressure at the GaN surface. Region 203 may be produced by depositing the GaAs using molecular beam epitaxy at low substrates temperatures. If the temperature of the substrate 201 is held at approximately 250° C. during the deposition of the Mg doped GaAs, the excess arsenic concentration (in excess of the normal GaAs stoichiometry of 1 As atom per 1 Ga atom) is approximately 1%. The p-type GaN region 201 has a thickness 221. The interface between layers 201 and layer 203 is denoted 251. A capping layer of AlGaAs 205 of thickness 225 is deposited on top of the GaAs layer 203 to preferentially confine the excess arsenic in the GaAs layer 203 and thereby increase the anion pressure at the GaN surface. In the preferred embodiment, the AlGaAs capping layer contains approximately 40% Al, and is also grown at low temperatures and heavily doped with Mg. The interface between layers 203 and 205 is denoted 253.

In FIG. 2B, the concentration of the Mg doping and of the excess arsenic are plotted as a function of depth along the growth direction of the epitaxial structure depicted in FIG. 2A. The Mg doping level 272 and excess As concentration 271 are also shown plotted on a logarithmic scale 298 against depth into the semiconductor layers 299.

In the preferred embodiment, subsequent to deposition of layers 203 and 205, the sample is annealed. In the preferred embodiment, the sample is annealed in using a rapid thermal processor, using an inert gas ambient such as nitrogen. In order to minimize desorption of the As anion from surface 255, it is preferable to place a piece of bulk GaAs on top of surface 255 during anneal. The preferred anneal recipe is to heat the sample to 1000° C. for 30 seconds.

FIG. 2C shows both the original Mg doping 272 and excess As concentration 271 plotted with the doping 272A and excess arsenic concentration 271A subsequent to a rapid the annealing process. We observe that the excess arsenic concentration and the Mg doping have diffused into the p-GaN region, with an exponentially decaying profile. In addition, there may be loss of the excess As anion and dopant ions through to surface 255.

Subsequent to annealing, the AlGaAs capping layer 205 and the GaAs source layer 203 are removed using a selective etch that preferentially etches GaAs and AlGaAs but does not etch GaN. Due to the high chemical stability of GaN, most common etches of GaAs will not etch GaN, and therefore may be used to expose surface 251.

Figures 2D, 2E:
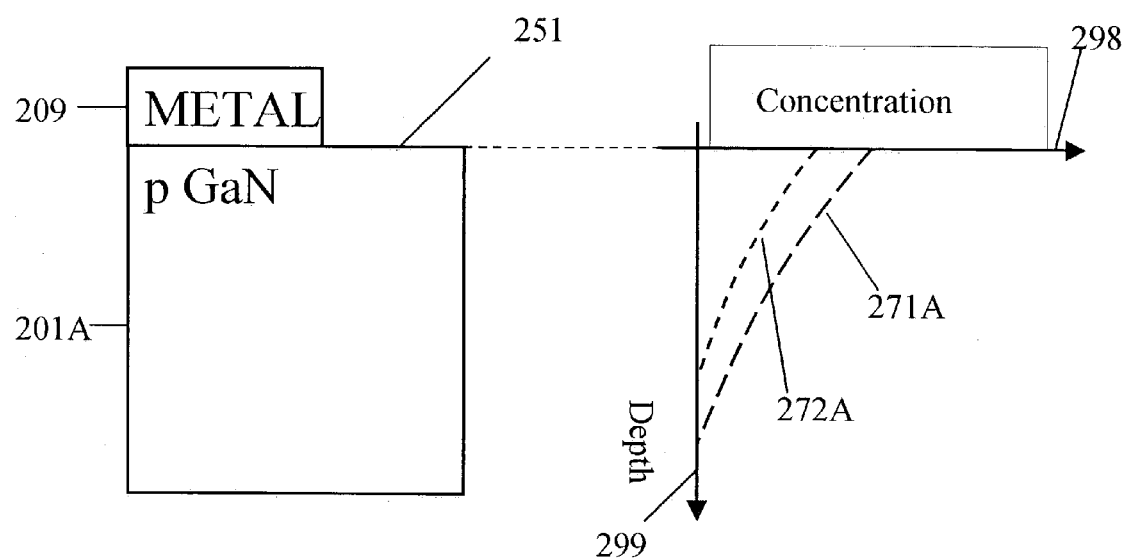

FIG. 2D shows the final hypercontacting structure after deposition of a suitable metal 209 such as Ni on the heavily doped p-GaN layer, 201A which now has an extremely high activated Mg doping level near the surface 251. The p-GaN layer is now denoted 201A because the doping profile and excess anion concentration of the contacting region has changed. FIG. 2E shows the final concentration as a function of depth into the p-Gan layer 201A which now contains a heavy Mg doping profile 272A and excess As concentration 271A as shown.

As those ordinarily skilled in the art will recognize, the details of the hyperdoping contact technology may be modified in order to optimize the resulting resistance. For example, the annealing temperature and time, the concentration of excess arsenic, the Mg doping concentration, the thickness of all of the layers, and the metal can all be optimized.

FIGS. 3A–E illustrate an alternative embodiment of the invention, that is intended to simplify processing by removing a number of processing steps compared to the preferred embodiment.

Figures 3A, 3B:
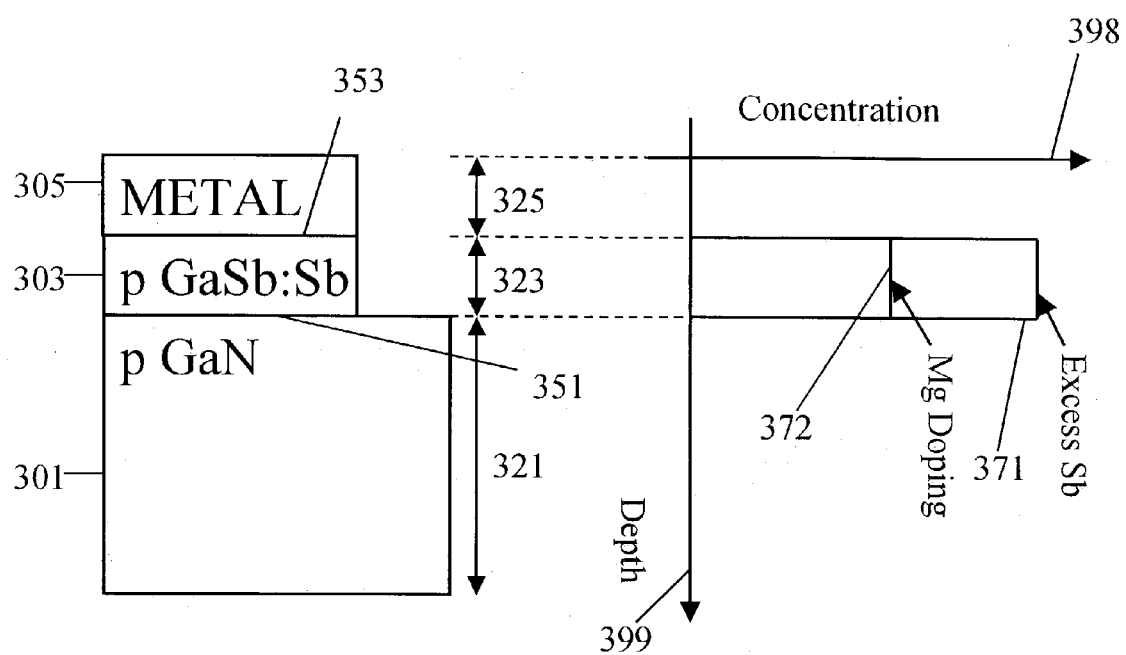
FIGS. 3A–E illustrate an alternative embodiment using an $p^{++}$GaSb as the source of excess anions and doping, and makes contact to the p-GaN through by first forming a low resistance ohmic contact between a refractory metal and the $p^{++}$GaSb, and then making low resistance ohmic contact between the $p^{++}$GaSb and the p-GaN.

In FIG. 3A a p-type doped GaN region 301 of thickness 321 has an interface 351 with a p doped region of GaSb 303 of thickness 323 containing excess Sb anions and a high Mg doping concentration. Layers 301 and 303 are patterned by lithographic processing techniques in order to confine the hypercontacting ohmic contact to a specific region of the device. Layer 303 has an interface 353 with a metal contacting layer 305 of thickness 325. The Mg doping level 372 and excess Sb concentration 371 are also shown in FIG. 3B plotted on a logarithmic scale 398 against depth into the semiconductor layers 399.

Figure 3C:
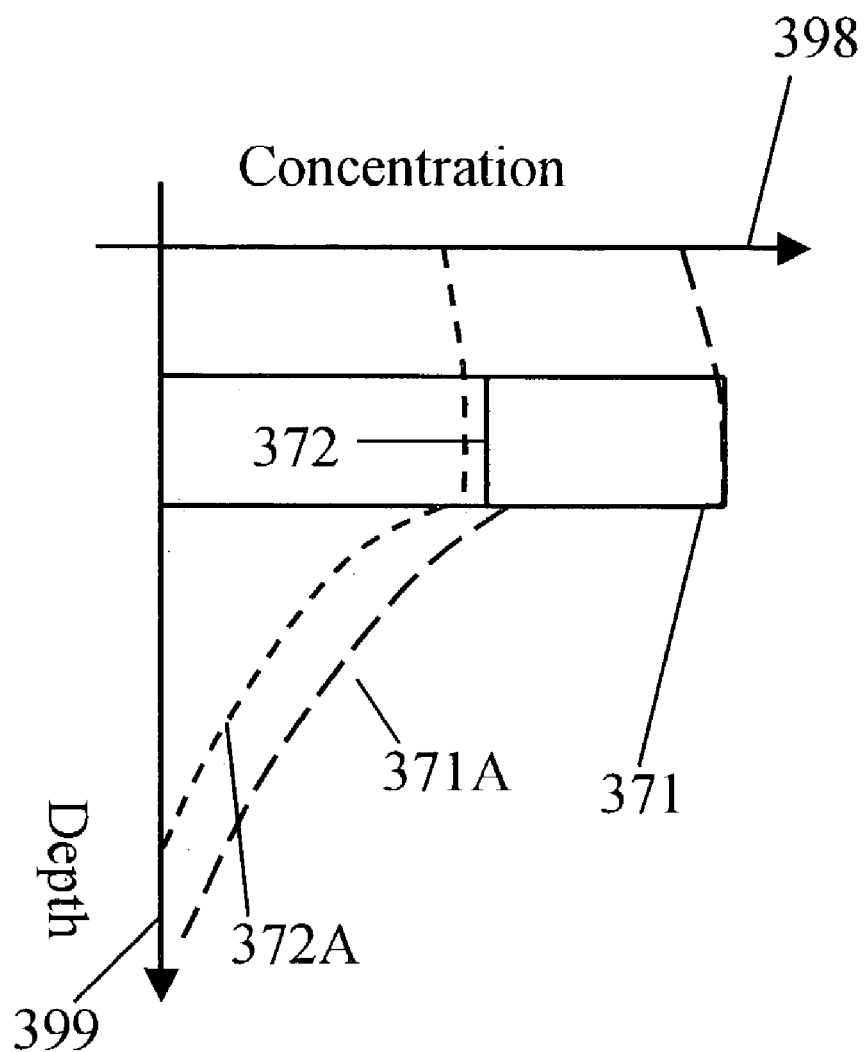

FIG. 3C shows both the original Mg doping 372 and excess Sb concentration 371 plotted with the doping 372A and excess arsenic concentration 371A subsequent to a rapid thermal annealing process.

Figures 3D, 3E:
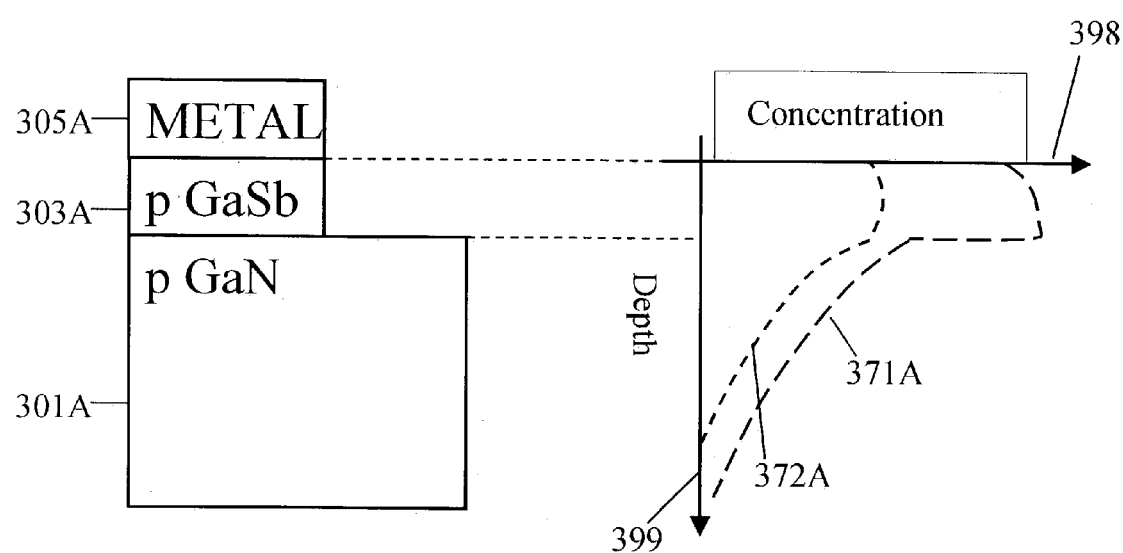

FIG. 3D shows the final contacting structure. Both the GaSb layer 305A and the GaN layer 201A now contain a Mg doping profile 272A and excess Sb concentration 271A as shown in FIG. 3E.

Figures 4A, 4B:
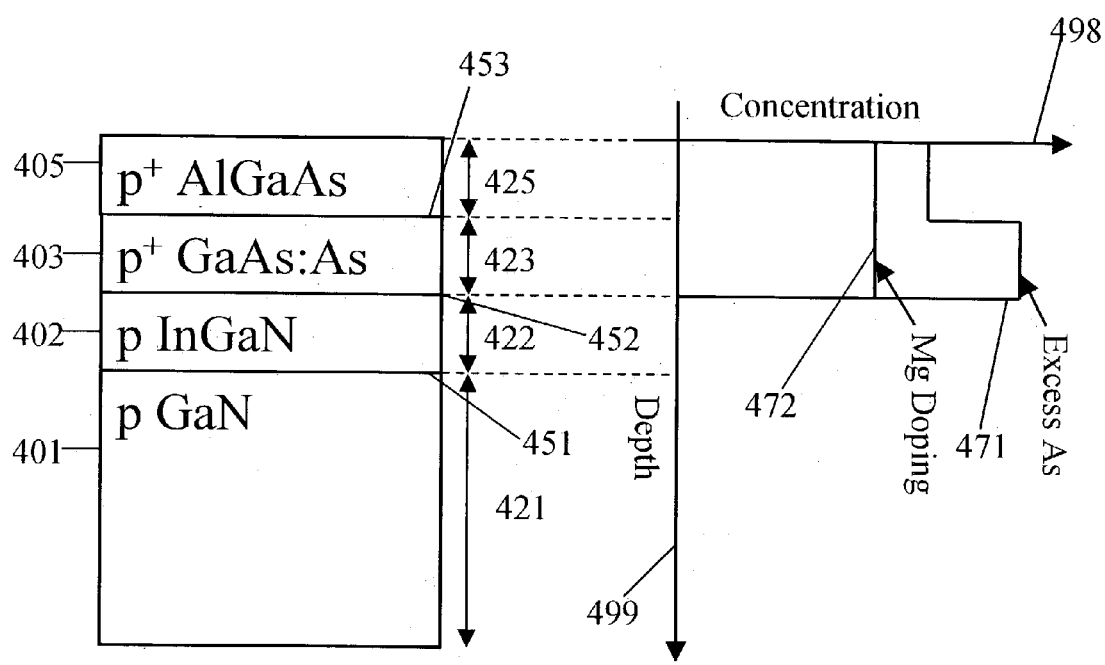
FIGS. 4A–E illustrate an alternative embodiment using an intermediate InGaN between the $p^{++}$GaAs source of excess anions and doping to simultaneously lower the Schottky barrier height and enable an increase in activated dopant in the surface InGaN region.

FIGS. 4A–E shows another alternative embodiment of the contacting structure, where an intermediate layer of InGaN is inserted between the p-GaN layer 401 and the GaAs dopant/anion source 403. Those ordinarily skilled in the art will recognize that the incorporation of such an intermediate layer can advantageously modify the Schottky barrier height, because different semiconductor regions have different work functions, as well as different surface states, thereby providing a position of the Fermi level at surface 452 compared to surface 451. In general, this intermediate layer utilizes a different compound semiconductor, such as alloys of InGaN, where the addition of In lowers the band gap, and therefore will typically also lower the Schottky barrier height. In addition, epitaxial techniques may be used to grade from GaN at interface 451 to InGaN at interface 452 by smoothly or digitally varying the In concentration. Of course, those ordinarily skilled in the art will recognize that other intermediate semiconductor layers may be used, such as GaAsN, GaInP, or any other arbitrary semiconductor layer. In FIG. 4A the p doped GaN region 401 of thickness 421 has an interface 451 with a p doped region of InGaN 402, of thickness 422 which forms an interface 452 with a $p^+$ doped region of GaAs containing excess As 403 of thickness 423, which in turn has an interface 453 with a $p^+$ doped capping layer of AlGaAs 405 of thickness 425. In FIG. 4B, the Mg doping concentration 472 and excess As concentration 471 are also shown plotted on a logarithmic scale 498 against depth into the semiconductor layers 499.

Figure 4C:
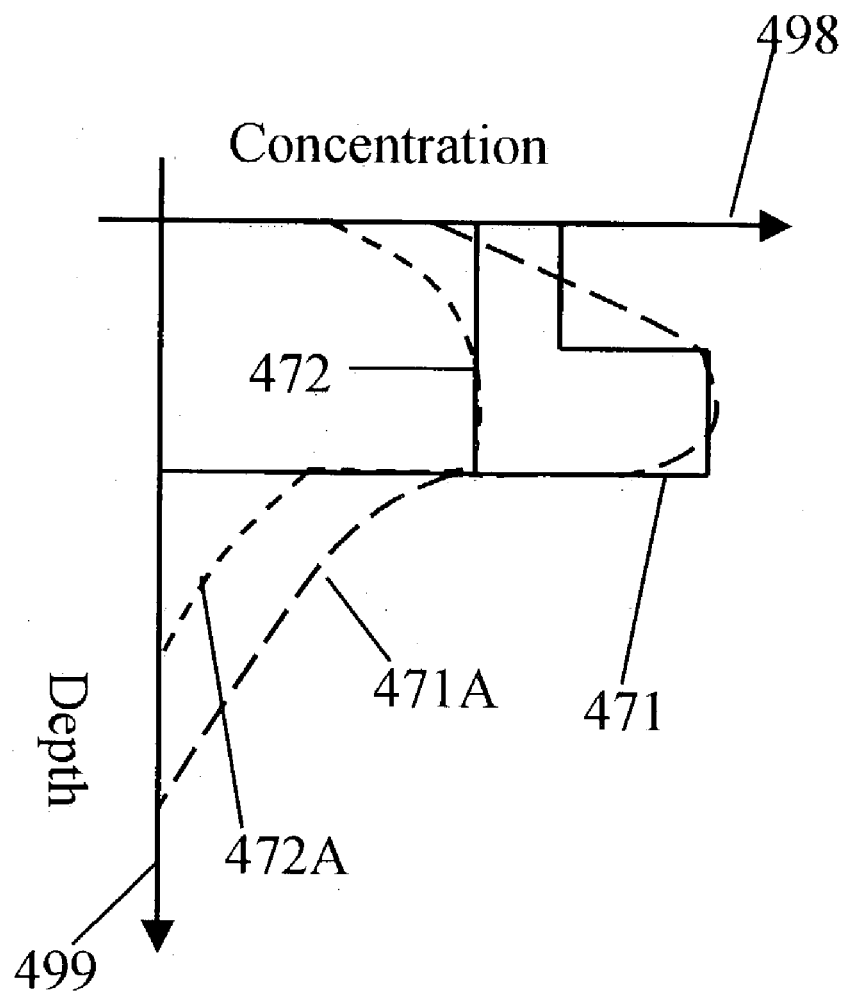

FIG. 4C shows both the original Mg doping 472 and excess As concentration 471 plotted along with the modified Mg doping profile 472A and excess arsenic concentration 471A subsequent to a rapid thermal annealing process, which is used to preferentially drive-in and activate the Mg dopant into the GaN region.

Figures 4D, 4E:
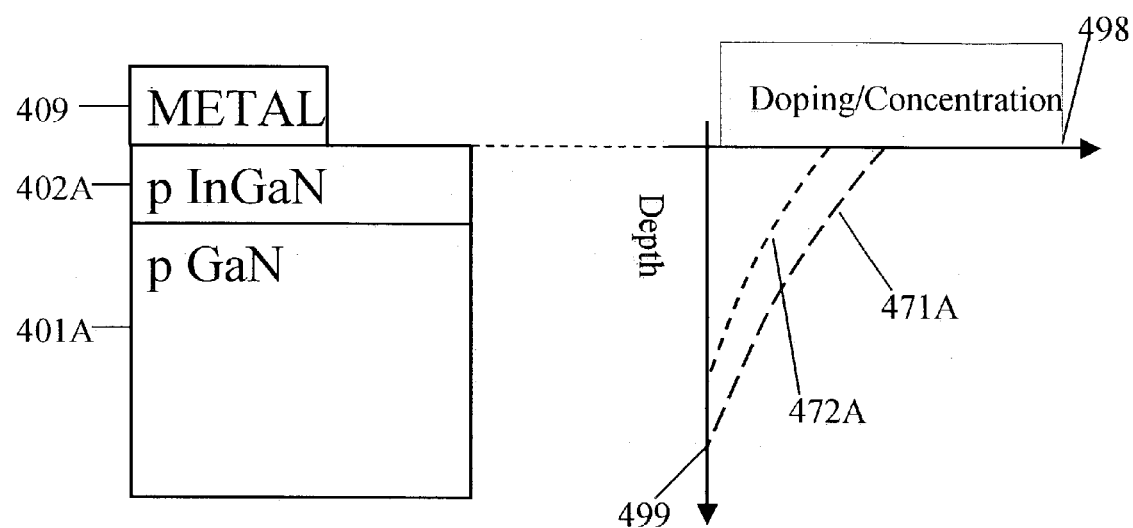

FIG. 4D shows the final contacting structure, where layers 403 and 405 have been stripped off and a patterned metal contact 409 deposited onto the modified InGaN region 402A which, along with the p doped GaN 401A now contains a Mg doping profile 472A and excess As concentration 471A as shown in FIG. 4E.

FIGS. 5A–E shows another alternative embodiment of the contacting structure, where dopant, and excess anions are implanted into the structure by means of ion implantation.

Figures 5A, 5B:
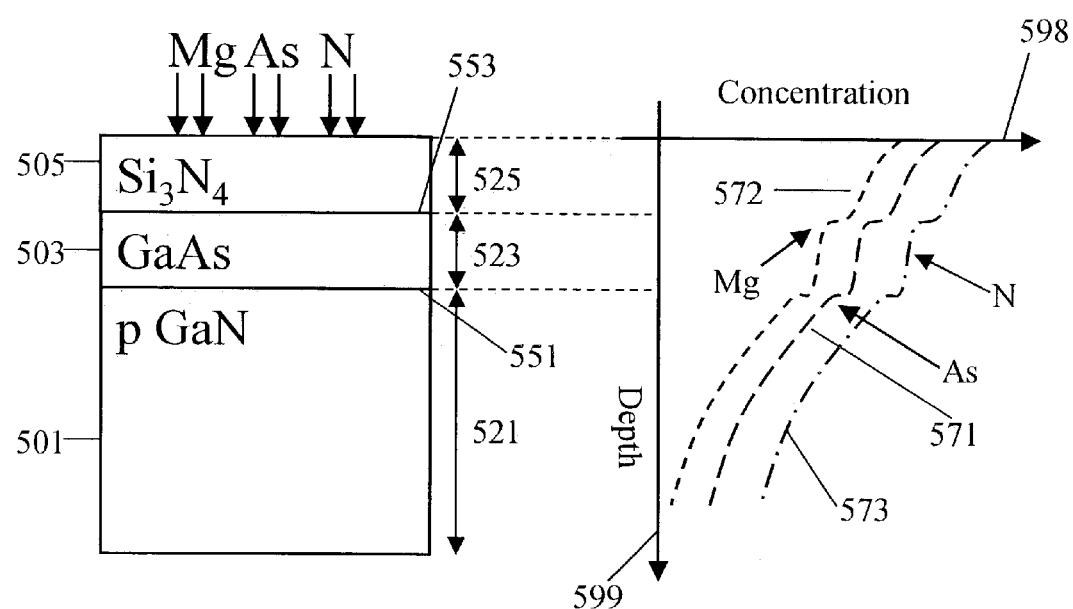

In FIG. 5A, a p doped GaN region 501 of thickness 521 has an interface 551 with a region of GaAs 503 of thickness 523, which can be either undoped or p-type doped and may or may not contain excess As, which in turn has an interface 553 with a capping layer of $Si_3N_4$ 505 of thickness 525. The GaAs layer may be deposited by any technique such as MBE, MOCVD, or even sputter deposition of polycrystalline GaAs. The Mg doping level 572 and excess As 571 and N 573 concentrations are also shown plotted on a logarithmic scale 598 against depth into the semiconductor layers 599 in FIG. 5B.

Figure 5C:
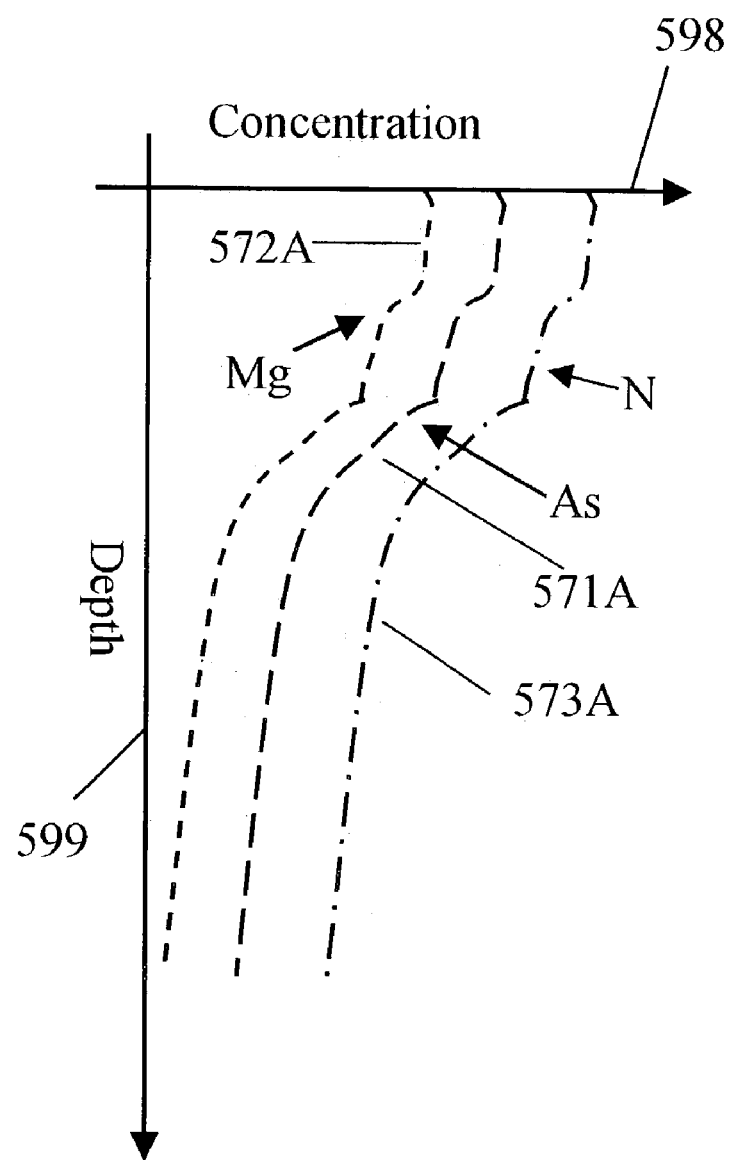

FIG. 5C shows the Mg doping 272A and excess As 571A and N 573A concentration subsequent to a rapid thermal annealing processing.

FIG. 5D shows the contacting structure, where layer 505 has been stripped off and a metal contact 509 deposited onto the GaAs 503A, which, like the p-type doped GaN 501A now contains a Mg doping profile 272A and excess As 271A and N 273A concentrations as shown in FIG. 5E.

Figure 6A:
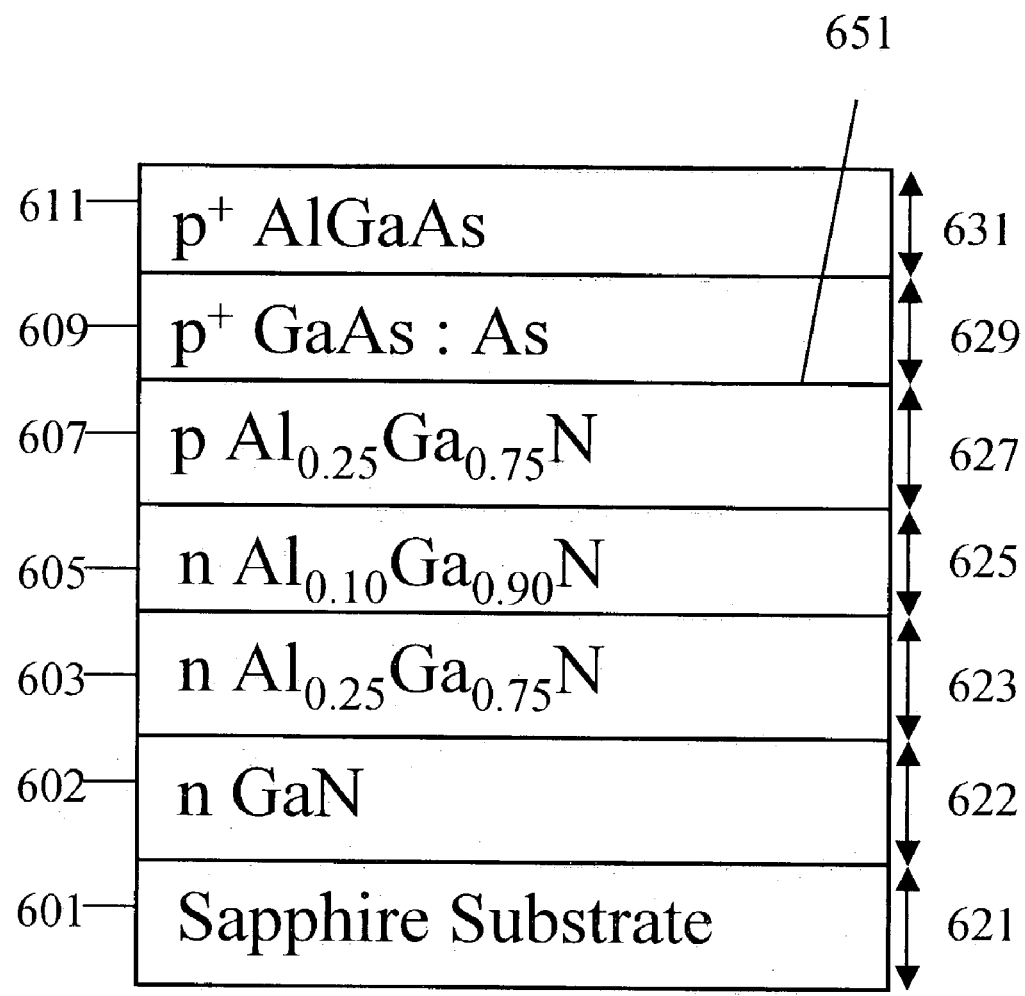
FIGS. 6A–B shows the hypercontact technology used to produce a low resistance contact to a UV LED structure.

FIG. 6A shows the hypercontact technology advantageously used to lower the resistance to the p-AlGaN side of a UV LED structure. Using hypercontact technology lowers the resistance of the p-type AlGaN contact, thereby enabling the UV LED to achieve lower forward operating voltage drops, lowered power dissipation for the same optical output power, higher optical output power at the same power dissipation, and higher reliability when compared to prior art implementations. Lower on resistance also enables faster modulation speeds because the resistance-capacitance (RC) product is lowered. Hypercontacting technology reduces the contact resistance and may be advantageously used to achieve optimizations of device structure and geometry well known to those ordinarily skilled in the art of LED design, enabling improved performance, higher efficiency, lower power dissipation, improved efficiency, improved modulation speed, and increased reliability. The AlGaN UV LED structure may deposited using conventional MOCVD or MBE deposition techniques on a sapphire substrate 601 with a thickness 621. First, the n-GaN contacting layer 602 with thickness 622 is deposited, followed by the $n-Al_{0.25}Ga_{0.75}N$ confinement layer 603 with thickness 623. The active $n-Al_{0.10}Ga_{0.90}N$ emitting layer 605 of thickness 625 is then deposited. Next, the $p-Al_{0.25}Ga_{0.75}N$ injector 607 is grown to a thickness of 627. The hypercontacting technology enables lower resistance ohmic contacts to layer 607 compared to prior art implementations. Post growth processing is used to deposit the hypercontact source layer 609 consisting of a $p^+$ GaAs:As with a thickness 629, which is used as source of excess As anion and Mg doping, followed by a $p^+$ AlGaAs capping layer 611 of thickness 631. Upon annealing, the Mg doping and excess As anion diffuse through surface 651 into the $p-Al_{0.25}Ga_{0.75}N$ injector, resulting in a very high ionized doping level near the surface 651.

Figure 6B:
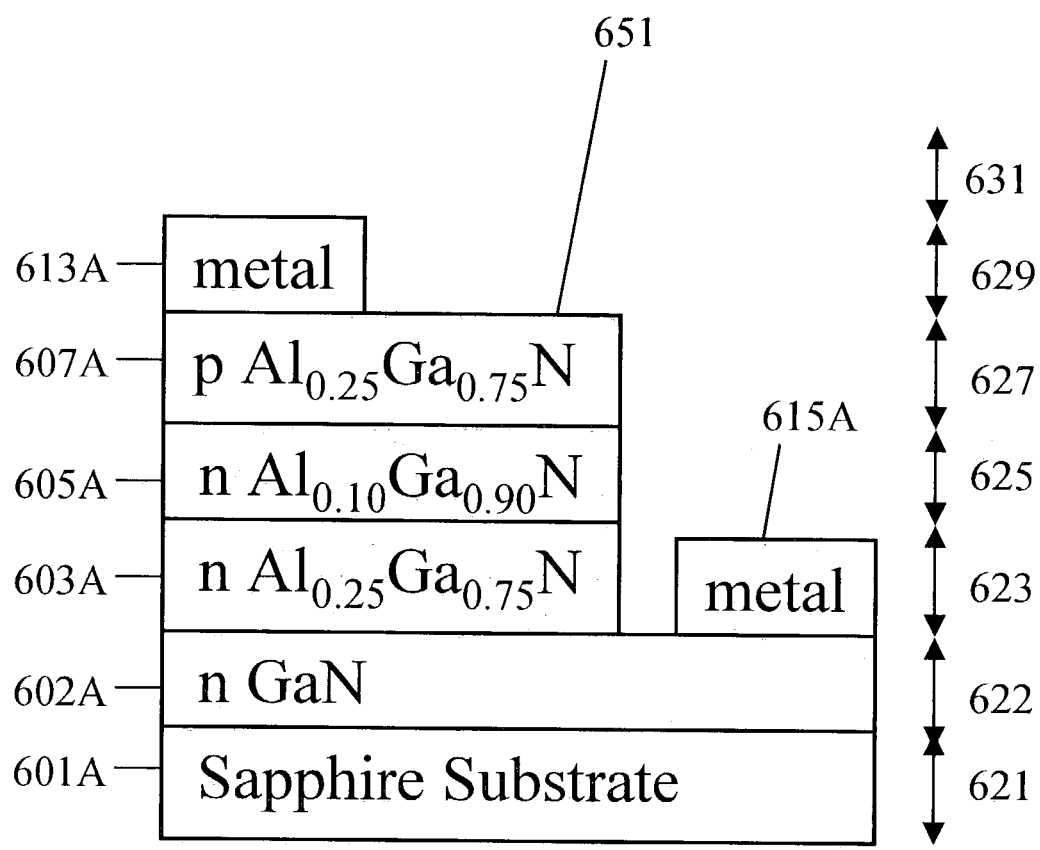

After rapid thermal annealing, the device structure is defined by conventional photolithography, etching, and metalization procedures, with the resulting device structure shown in FIG. 6B. The sapphire substrate 601A and n-GaN layer 602A correspond to layers 601 and 602 after processing to define the UV LED. Conventional alloyed metal contact 615A is used to provide low resistance ohmic contact to layer 602A. The $n-Al_{0.25}Ga_{0.75}N$ confinement layer 603A corresponds to layer 603 after mesa etching to define the lateral extent of the LED structure. Likewise, the active $n-Al_{0.10}Ga_{0.90}N$ emitting layer 605A corresponds to layer 605 after mesa etching to define the lateral extent of the LED structure. Finally, layer 607A corresponds to the $p-Al_{0.25}Ga_{0.75}N$ injector 607 after completion of the hypercontacting process, where layers 609 and 611 have been removed by etching. Metal contact 613A is deposited and defined with photolithography and etching to complete the hypercontact, making low resistance ohmic contact to layer 607A.

Figure 7A:
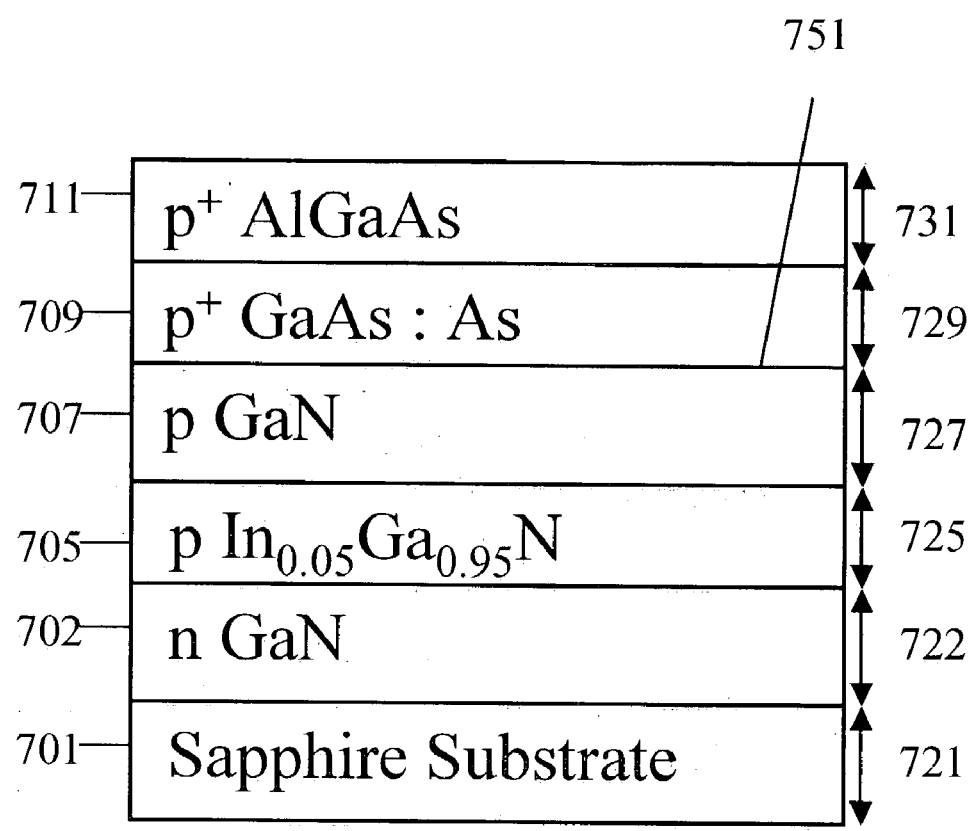
FIGS. 7A–B shows the hypercontact technology used to produce a low resistance contact to a blue laser diode.

FIG. 7A shows the hypercontact technology advantageously used to reduce the resistance of the contact to the p-GaN side of blue laser diode compared to prior art implementations of the p-side contact. Using hypercontact technology lowers the resistance of the p-type GaN contact, thereby enabling the blue laser diode to achieve lower threshold voltages for lasing, lowered power dissipation for the same optical output power, higher optical output power at the same power dissipation, and higher reliability when compared to prior art implementations. Lower resistance also enables faster modulation speeds because the resistance-capacitance (RC) product is lowered. Hypercontacting technology reduces the contact resistance and may be advantageously used to achieve optimizations of device structure and geometry well known to those ordinarily skilled in the art of blue laser design, enabling improved performance, higher efficiency, lower power dissipation, improved efficiency, improved modulation speed, and increased reliability. The laser diode structure is deposited using conventional MOCVD or MBE deposition techniques on a sapphire substrate 701 with a thickness 721. First, the n-GaN contacting layer 702 with thickness 722 is deposited, followed by the p-$In_{0.05}Ga_{0.95}N$ active layer 705 with thickness 625. Next, the p-GaN injector 707 is grown to a thickness of 727. Post growth processing is used to deposit the hypercontact source layer 709 consisting of a $p^+$ GaAs:As of thickness 729, which is used as source of excess As anion and Mg doping, followed by a $p^+$ AlGaAs capping layer 711 of thickness 731. Upon annealing, the Mg doping and excess As anion diffuse through surface 751 into the p-GaN injector, resulting in a very high ionized doping level near the surface 751.

Figure 7B:
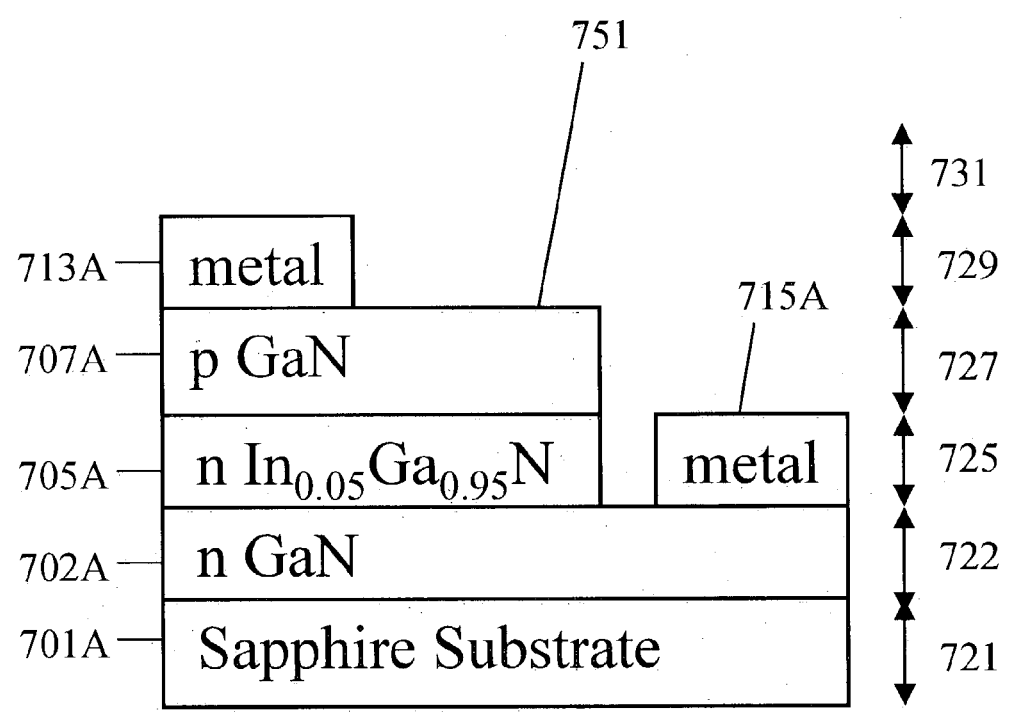

After rapid thermal annealing, the device structure is defined by conventional photolithography, etching, and metalization procedures with the resulting device structure shown in FIG. 7B. The sapphire substrate 701A and n-GaN layer 702A correspond to layers 701 and 702 after processing to define the laser diode. Conventional alloyed metal contact 715A is used to provide low resistance ohmic contact to layer 702A. The active n-$In_{0.05}Ga_{0.95}N$ emitting layer 705A corresponds to layer 705 after mesa etching to define the lateral extent of the laser. Finally, layer 707A corresponds to the p-GaN injector 707 after the hypercontact annealing procedure and etching to define the lateral extent of the laser. Metal contact 713A is deposited and defined with photolithography and etching to complete the hypercontact, making low resistance ohmic contact to layer 707A.

Figure 8:
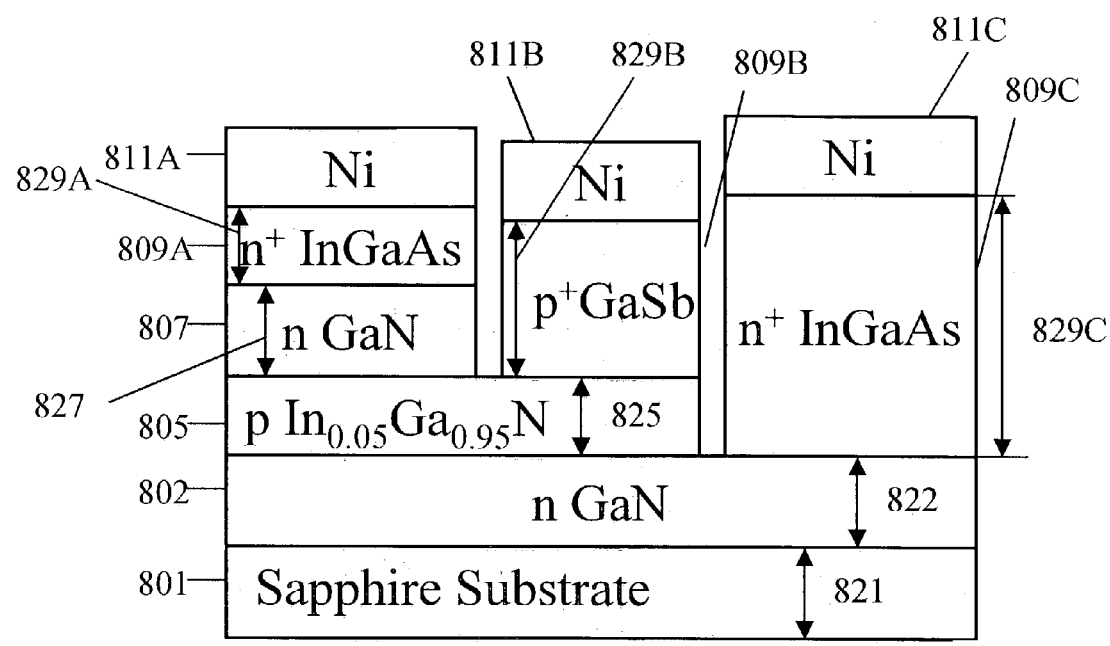
FIG. 8 show the hypercontact technology used to produce a low resistance contacts to the emitter, base, and collector regions of a double heterostructure bipolar transistor (DHBT) structure.

FIG. 8 show the hypercontact technology advantageously used to lower the contact resistance to a n-GaN/p-InGaN/n-GaN DHBT structure. Lowered contact resistance through the use of hypercontacting technology can be used by those ordinarily skilled in the art of HBT design to lower the power dissipation, decrease the knee voltage, increase the power added efficiency, and increase the modulation speed by lowering RC delays. The epitaxial HBT structure is grown on a sapphire substrate 801 of thickness 821, consisting of a n-GaN collector layer 802 of thickness 822, followed by a p-$In_{0.05}Ga_{0.95}N$ base region 805 of thickness 825, and finally with a n-GaN emitter layer 807 of thickness 827. Post growth processing is used to deposit hypercontacting layers that provide the source of excess anion and doping to the emitter, base, and collector. An n-InGaAs layer 809A of thickness 829A providing a source of n-type dopant and excess anion is deposited directly on top of the emitter layer 807. A Ni metal layer 811A is used to simultaneously provide low resistance contact to the InGaAs layer 809A as well as encapsulate layer 890A for post deposition annealing. Upon annealing, the n-InGaAs layer 809A provides doping and excess anion to layer 807, forming a hypercontact between layers 807 and 809. Thus, metal layer 811A provides a conventional contact to the InGaAs layer 809A, which provides a low resistance path to the n-GaN emitter layer 807. Similarly, a p-GaSb layer 809B of thickness 829B providing a source of p-type dopant and excess anion is deposited on top of the base layer 805. A Ni metal contact and encapsulant layer 811B completes the contact structure to the base 805. Upon anneal, the p-type dopant and excess anion from layer 809B diffuse into the base layer 805, producing a hypercontact between layers 809B and 805. Layer 811B produces a low resistance conventional contact to layer 809B, which provides a low resistance path to the hypercontact formed between layers 809B and 805. Similarly, an n-InGaAs layer 809C of thickness 829C providing source of n-type dopant and excess anion is deposited on top of the collector layer 802. A Ni metal contact and encapsulant layer 811C completes the contact structure to the collector 802. Upon anneal, the n-type dopant and excess anion from layer 809C diffuse into the collector layer 802, producing a hypercontact between layers 809C and 802. Layer 811C produces a low resistance conventional contact to layer 811C, which provides a low resistance path to the hypercontact formed between layers 809C and 802.

Figure 9A:
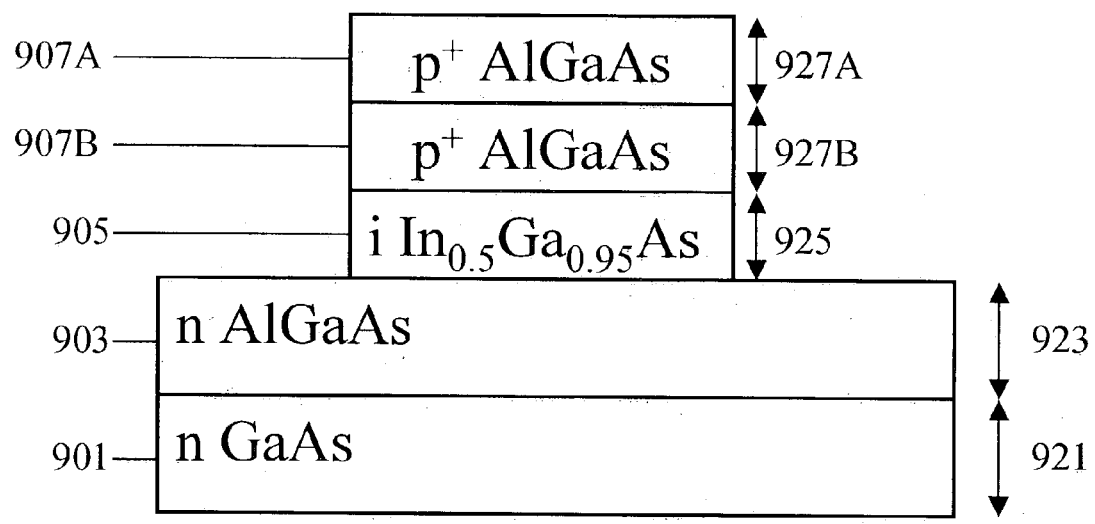
FIGS. 9A–B show the hypercontact technology used with epitaxial regrowth.
Figure 9B:
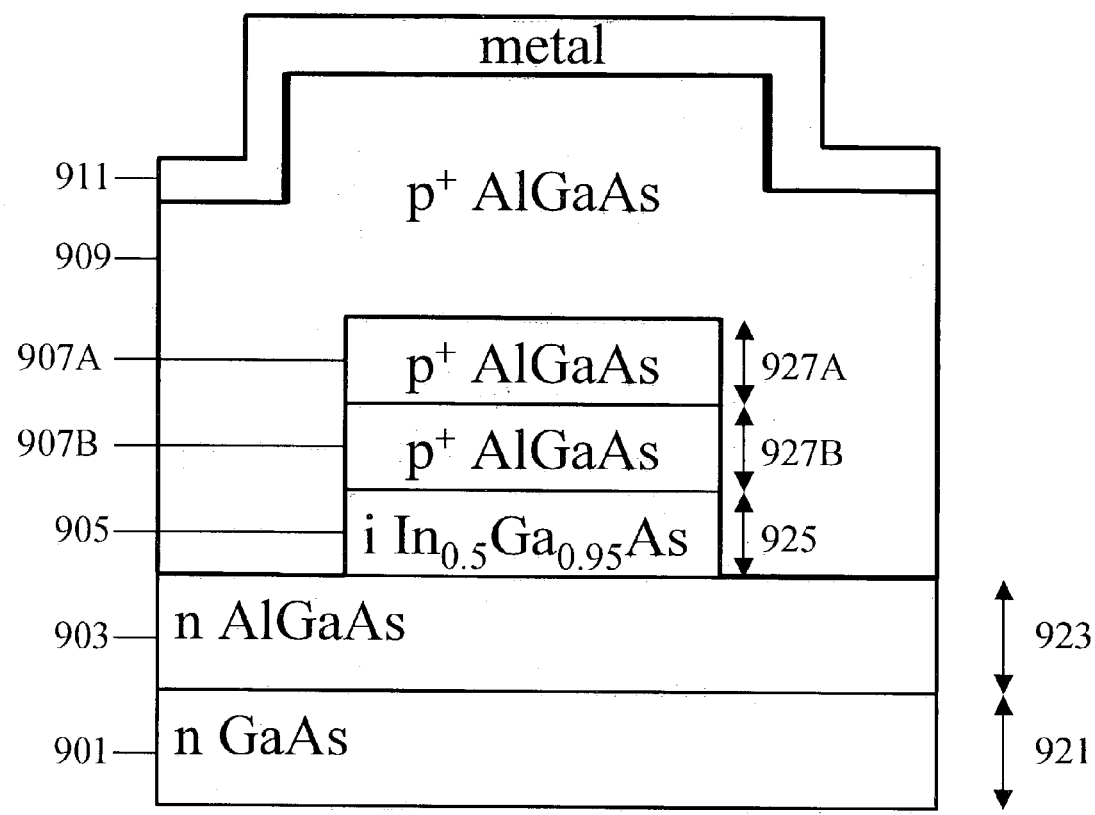

Reference is now made to FIGS. 9A–B, which illustrates application of the hypercontacting technology to epitaxial regrowth. Regrowth is used by those ordinarily skilled in the art to provide three-dimensional heterojunction, not just the two dimensional planar junctions possible with conventional, single step epitaxial growth. One example is the index guided laser structure shown in FIG. 9A. During a first epitaxial deposition, layers 901, 903, 905, and 907B and 907A are deposited using conventional epitaxial techniques. Layer 901 of thickness 921 is the n-GaAs contacting layer, layer 903 of thickness 923 is the n-AlGaAs bottom cladding layer, layer 905 of thickness 925 is an $In_{0.05}Ga_{0.95}As$ quantum well emitting region, and layers 907A and 907B of thickness 927A and 927B, respectively, are the top p-AlGaAs cladding layer. Layers 905, 907A and 907B are patterned laterally (as shown in FIG. 9A) to define the lateral extent of the laser stripe mesa.

To achieve index guiding in 3 dimensions it is desirable to use re-growth to deposit a lattice matched, low refractive index semiconductor around the laser stripe mesa. This can be done as shown in FIG. 9B, where p+ AlGaAs layer 909 is deposited in a second epitaxial step to surround the laser strip mesa consisting of layers 905, 907A and 907B. The hypercontacting technology can be used to facilitate ohmic contacts between layers 907A and 909. Furthermore, the since the hypercontact technology preferably involves the use of excess anion(s), this can be readily achieved by using heavy Zn doping and low temperature growth of layer 909 using MBE. The use of low growth temperatures is advantageous because it reduces the thermal budget of the processing and reduces the stress on the epitaxial layer structure. To complete the hypercontact, a metal layer 911 is deposited on top of layer 909, and the structure is annealed. In some index guided laser designs, it will desirable to have a low resistance ohmic contact between layers 909 and 907A, but to insure that a higher resistance is achieved between layers 909 and 907B, 905, and 903, thereby forcing most of the current to flow first through layer 907A, into layer 907B, and then into the active layer 905. One way to selectively make such a hypercontact is to use layer 907A as the source of excess anion and dopant, for example, layer 907A should provide a high density of both a p-type dopant ion (such as Zn) and a high density of anions (such as As). This configuration would enable a very low resistance ohmic contact to be formed between layers 909 and 907A, while forcing all other junction with layer 909 to exhibit a higher resistance. Hypercontacting technology therefore enables a regrowth technology to use lower quality interfaces and lower temperature growth (during regrowth) without sacrificing the electrical properties of the interface. Such regrowth technology can be used by those ordinarily skilled in the art to produce lower series resistance through regrowth structures, which can be advantageously used to lower power dissipation, increase reliability, increase optical output power, increase modulation speed, and provide improved control of the three-dimensional heterojunction profile, including the refractive index variations produced by this three-dimensional heterojunction profile.

The invention claimed is:

1. Forming a p-type electrical contact to a compound semiconductor using a method for increasing the concentration of a donor or acceptor ion at or near the surface of the compound semiconductor material, the method comprising the steps of: (a) having a dopant concentration in said semiconductor; and, (b) increasing the activation of said dopant into said donor or acceptor ions in the semiconductor by increasing the vapor pressure of a cation in said semiconductor thereby increasing the probability of a dopant atom from group IVB substituting for an anion and thereby being activated as an acceptor ion, relative to the probabilities of said dopant forming a precipitate or occupying an interstitial site or becoming inert or becoming a compensating donor ion.

2. Forming an n-type electrical contact to a compound semiconductor using a method for increasing the concentration of a donor or acceptor ion at or near the surface of the compound semiconductor material, comprising the steps of: (a) having a dopant concentration in said semiconductor; and, (b) increasing the activation of said dopant into said donor or acceptor ions in the semiconductor by increasing the vapor pressure of a cation in said semiconductor thereby increasing the probability of a dopant atom from group VIB substituting for an anion and thereby being activated as a donor ion, relative to the probabilities of said dopant forming a precipitate or occupying an interstitial site or becoming inert or becoming a compensating acceptor ion.

* * * * *